United States Patent
Song

(10) Patent No.: US 9,543,467 B2
(45) Date of Patent: Jan. 10, 2017

(54) LIGHT EMITTING DEVICE

(75) Inventor: June O Song, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 1327 days.

(21) Appl. No.: 12/937,453

(22) PCT Filed: Apr. 13, 2009

(86) PCT No.: PCT/KR2009/001886
§ 371 (c)(1),
(2), (4) Date: Feb. 28, 2011

(87) PCT Pub. No.: WO2009/126010
PCT Pub. Date: Oct. 15, 2009

(65) Prior Publication Data
US 2011/0140077 A1    Jun. 16, 2011

(30) Foreign Application Priority Data

Apr. 12, 2008  (KR) .................. 10-2008-0033966
Apr. 12, 2008  (KR) .................. 10-2008-0033967
Apr. 13, 2008  (KR) .................. 10-2008-0033986
Apr. 13, 2008  (KR) .................. 10-2008-0033987

(51) Int. Cl.
| H01L 31/00 | (2006.01) |
|---|---|
| H01L 33/04 | (2010.01) |
| H01L 33/14 | (2010.01) |
| H01L 33/32 | (2010.01) |
| B82Y 20/00 | (2011.01) |
| H01L 33/06 | (2010.01) |

(52) U.S. Cl.
CPC .............. *H01L 33/04* (2013.01); *H01L 33/14* (2013.01); *B82Y 20/00* (2013.01); *H01L 33/06* (2013.01); *H01L 33/32* (2013.01)

(58) Field of Classification Search
CPC .......... H01L 33/32; H01L 33/06; H01L 33/14; B82Y 20/00
USPC ...................................... 257/13, 98
See application file for complete search history.

(56) References Cited

U.S. PATENT DOCUMENTS

| 5,563,422 A | 10/1996 | Nakamura et al. |
| 7,193,246 B1* | 3/2007 | Tanizawa ............... B82Y 20/00 257/101 |

(Continued)

FOREIGN PATENT DOCUMENTS

| JP | 11-340509 | 12/1999 |
| JP | 2006-128227 | 5/2006 |

(Continued)

OTHER PUBLICATIONS

International Search Report issued in PCT/KR2009/001886 dated Nov. 26, 2009.

(Continued)

*Primary Examiner* — Dale E Page
(74) *Attorney, Agent, or Firm* — Ked & Associates, LLP

(57) ABSTRACT

Disclosed is a light emitting device. The light emitting device includes a first conductive semiconductor layer, an active layer over the first conductive semiconductor layer, a second conductive semiconductor layer over the active layer, a superlattice structure layer over the second conductive semiconductor layer, and a first current spreading layer including a transmissive conductive thin film over the superlattice structure layer.

24 Claims, 5 Drawing Sheets

(56) References Cited

U.S. PATENT DOCUMENTS

| | | | |
|---|---|---|---|
| 2004/0155248 A1 | 8/2004 | Fukuda et al. | |
| 2005/0077537 A1* | 4/2005 | Seong | H01L 33/42 257/103 |
| 2005/0199888 A1* | 9/2005 | Seong | H01L 33/387 257/79 |
| 2006/0215723 A1* | 9/2006 | Watanabe | 372/103 |
| 2008/0191195 A1 | 8/2008 | Tanizawa et al. | |
| 2008/0296598 A1* | 12/2008 | Wang | H01L 33/44 257/98 |
| 2009/0028202 A1 | 1/2009 | Jeong | |

FOREIGN PATENT DOCUMENTS

| | | |
|---|---|---|
| JP | 2008-060331 A | 3/2008 |
| KR | 10-2004-008216 A | 1/2004 |
| KR | 10-2007-0015709 | 2/2007 |
| KR | 10-2007-0028095 A | 3/2007 |

OTHER PUBLICATIONS

Korean Office Action dated Mar. 7, 2014 issued in Application No. 10-2008-0033966.
Korean Office Action dated Mar. 7, 2014 issued in Application No. 10-2008-0033967.
Korean Office Action dated Mar. 7, 2014 issued in Application No. 10-2008-0033986.
Korean Office Action dated Mar. 7, 2014 issued in Application No. 10-2008-0033987.

* cited by examiner

LIGHT EMITTING DEVICE

CROSS-REFERENCE TO RELATED PATENT APPLICATIONS

This application is a U.S. National Stage Application under 35 U.S.C. §371 of PCT Application No. PCT/KR2009/001886, filed Apr. 13, 2009, which claims priority to Korean Patent Application Nos. 10-2008-0033966, filed on Apr. 12, 2008, 10-2008-0033967, filed on Apr. 12, 2008, 10-2008-0033986, filed on Apr. 13, 2008 and 10-2008-0033987, filed on Apr. 13, 2008.

TECHNICAL FIELD

The embodiment relates to a light emitting device.

BACKGROUND ART

Recently, a light emitting diode (LED) is spotlighted as a light emitting device. Since the LED can convert electric energy into light energy with high efficiency and long life span of about 5 years or more, the LED can remarkably reduce the energy consumption and repair and maintenance cost. In this regard, the LED is spotlighted in the next-generation lighting field.

Such an LED is prepared as a light emitting semiconductor layer including a first conductive semiconductor layer, an active layer and a second conductive semiconductor layer, in which the active layer generates light according to current applied thereto through the first and second conductive semiconductor layers.

Meanwhile, in the LED, since the second conductive semiconductor layer has relatively high sheet resistance due to low carrier concentration and mobility, a transparent current spreading layer is required to form an ohmic contact interface with respect to a top surface of the second conductive semiconductor layer.

When the transparent current spreading layer including ITO or ZnO is formed on the second conductive semiconductor layer to form an ohmic contact interface, the transparent current spreading layer may form a schottky contact interface instead of the ohmic contact interface due to subsequent processes such as deposition and annealing processes.

In order to improve light extraction efficiency of the LED, researches and studies for forming a light extracting structure having a concave-convex pattern on the surface of the current spreading layer have been carried out. However, when the light extracting structure is formed on the current spreading layer directly provided on the second conductive semiconductor layer, the LED is electrically damaged, so that a driving voltage and a leakage current may be increased.

DISCLOSURE

Technical Problem

The embodiment provides a light emitting device having a new structure and a method of manufacturing the same.

The embodiment provides a light emitting device having improved electrical characteristics and a method of manufacturing the same.

The embodiment provides a light emitting device having improved light efficiency and a method of manufacturing the same.

Technical Solution

According to the embodiment, a light emitting device includes a first conductive semiconductor layer, an active layer over the first conductive semiconductor layer, a second conductive semiconductor layer over the active layer, a superlattice structure layer over the second conductive semiconductor layer, and a first current spreading layer including a transmissive conductive thin film over the superlattice structure layer.

According to the embodiment, a light emitting device includes a first conductive semiconductor layer, an active layer over the first conductive semiconductor layer, a second conductive semiconductor layer over the active layer, a superlattice structure layer over the second conductive semiconductor layer, a first current spreading layer including a transmissive conductive thin film over the superlattice structure layer, and a third current spreading layer over the first current spreading layer, the third current spreading layer including a reflective conductive thin film.

Advantageous Effects

The embodiment can provide a light emitting device having a new structure and a method of manufacturing the same.

The embodiment can provide a light emitting device having improved electrical characteristics and a method of manufacturing the same.

The embodiment can provide a light emitting device having improved light efficiency and a method of manufacturing the same.

BEST MODE

[Mode for Invention]

Figure 1:
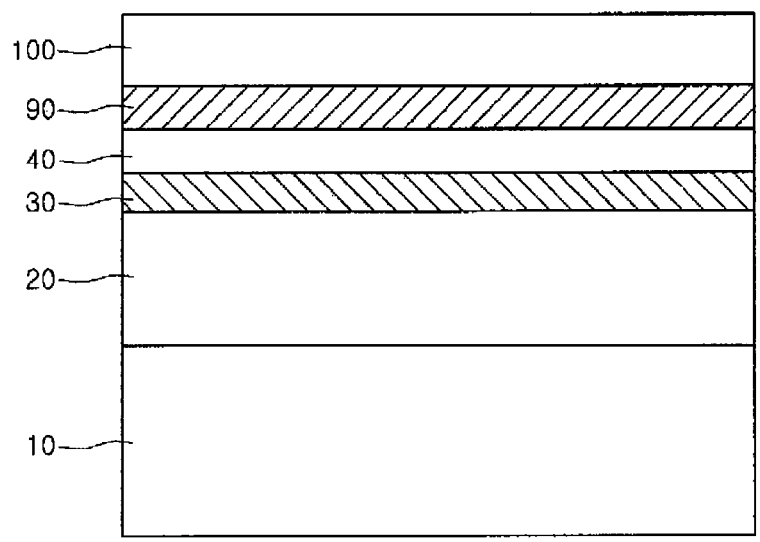
FIG. 1 is a sectional view showing the structure of a light emitting device according to an embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

FIG. 1 is a sectional view showing the structure of a light emitting device according to an embodiment.

Referring to FIG. 1, a light emitting semiconductor layer including a first conductive semiconductor layer 20, an active layer 30, and a second conductive semiconductor layer 40 is formed on a growth substrate 10.

Then, a superlattice structure layer 90 and a first current spreading layer 100 are formed on the second conductive semiconductor layer 40.

In more detail, for example, the growth substrate 10 may include one selected from the group consisting of $Al_2O_3$, SiC, Si, AlN, GaN, AlGaN, Glass, and GaAs.

Although not shown, a buffer layer may be formed between the growth substrate 10 and the first conductive semiconductor layer 20. The buffer layer is formed on the growth substrate 10 for the purpose of lattice match. The buffer layer may include at least one selected from the group consisting of InGaN, AlN, SiC, SiCN, and GaN.

The light emitting semiconductor layer including the first conductive semiconductor layer 20, the active layer 30, and the second conductive semiconductor layer 40 may include a group III nitride-based semiconductor material. For example, the first conductive semiconductor layer 20 may include a gallium nitride layer including N type impurities such as Si, and the second conductive semiconductor layer 40 may include a gallium nitride layer including P type impurities such as Mg or Zn.

In addition, the active layer 30 generates light through the recombination of electrons and holes. For example, the active layer 30 may include one selected from the group consisting of InGaN, AlGaN, GaN, and AlInGaN. A wavelength of light emitted from the light emitting device is determined according to the type of a material constituting the active layer 30.

The active layer 30 may have a stack structure including a well layer and a barrier layer. The energy band gap of a material constituting the barrier layer may be greater than that of a material constituting the well layer, and the thickness of the barrier layer may be thicker than that of the well layer.

The superlattice structure layer 90 may increase the effective concentration of holes by reducing dopant activation energy of the second conducive semiconductor layer 40, or may cause a quantum mechanical tunneling conductive phenomenon through band-gap engineering.

The superlattice structure layer 90 may have a multi-layer structure, and each layer forming the superlattice structure layer 90 may be formed at a thickness of 5 nm or less. Each layer forming the superlattice structure layer 90 may include at least one selected from the group consisting of InN, InGaN, InAlN, AlGaN, GaN, AlInGaN, AlN, SiC, SiCN, MgN, ZnN, and SiN, and may be doped with Si, Mg, or Zn. For example, the superlattice structure layer 90 may have a multi-layer structure such as InGaN/GaN, AlGaN/GaN, InGaN/GaN/AlGaN, or AlGaN/GaN/InGaN.

The superlattice structure layer 90 may have a single layer structure. For example, the superlattice structure layer 90 may include an InGaN layer doped with N type impurities, or an InGaN layer doped with P type impurities.

The first current spreading layer 100 may form an ohmic contact interface, and may include a group III nitride-based conductive thin film having sheet resistance of 50Ω/□ or less.

The first current spreading layer 100 may include a single layer structure or a multi-layer structure represented through a chemical formula of $In_xAl_yGa_{(1-x-y)}N$ (0≤x, 0≤y, x+y≤1) and having a thickness of 6 nm or more. In addition, the first current spreading layer 100 may be doped with Si, Mg, or Zn. For example, the first current spreading layer 100 may include GaN doped with Si or AlGaN doped with Si.

The light emitting semiconductor layer, the superlattice structure layer 90, and the first current spreading layer 100 may be subsequently grown in-situ by using equipment such as MOCVD, MBE, HVPE, sputter, or PLD. In addition, after the light emitting semiconductor layer and the superlattice structure layer 90 have been subsequently grown in-situ, the first current spreading layer 100 maybe grown from the superlattice structure layer 90 ex-situ.

Figure 2:
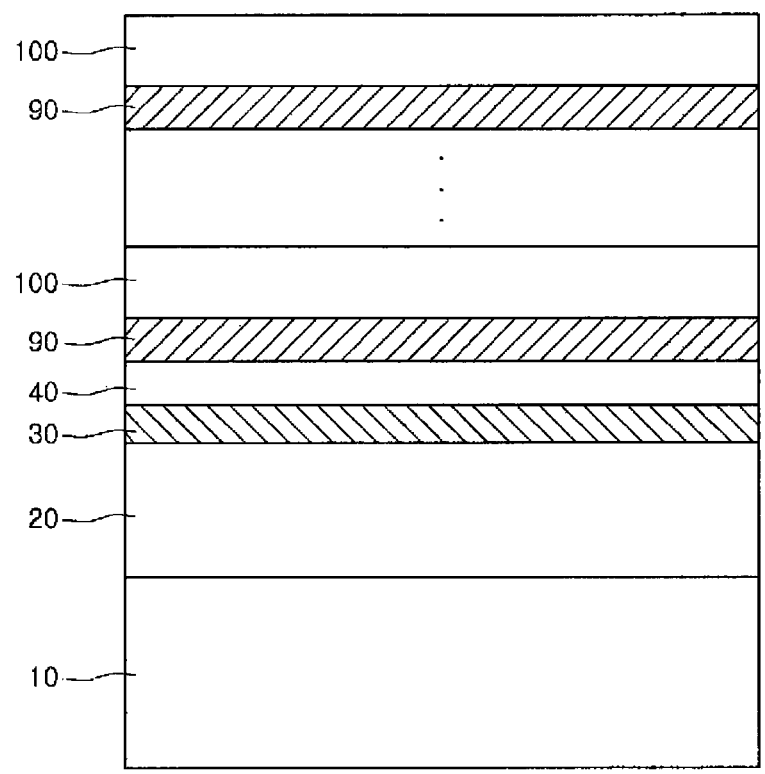
FIG. 2 is a sectional view showing the structure of a light emitting device according to another embodiment.

FIG. 2 is a sectional view showing the structure of a light emitting device according to another embodiment.

The following description will be made with reference to FIG. 2 while focusing on the difference from FIG. 1. The light emitting semiconductor layer including the first conductive semiconductor layer 20, the active layer 30, and the second conductive semiconductor layer 40 is formed on the growth substrate 10. Then, the superlattice structure layer 90 and the first current spreading layer 100 are formed on the second conductive semiconductor layer 40.

As shown in FIG. 2, the stack structure of the superlattice structure layer 90 and the first current spreading layer 100 may be repeatedly formed.

The superlattice structure layer 90 of FIGS. 1 and 2 has a structure similar to that of the active layer 30 including a well layer and a barrier layer. However, while the barrier layer of the active layer 30 is thicker than the quantum well layer, the superlattice structure layer 90 includes layers having a thin thickness of 5 nm or less.

The quantum well layer and the barrier layer of the active layer 30 confine electrons or holes acting as carriers into the well layer between the thick barrier layers. However, the superlattice structure layer 90 allows the electrons or holes acting as carriers to smoothly flow.

Therefore, the superlattice structure layer 90 forms an ohmic contact interface with respect to the second conductive semiconductor layer 40.

Figure 3:
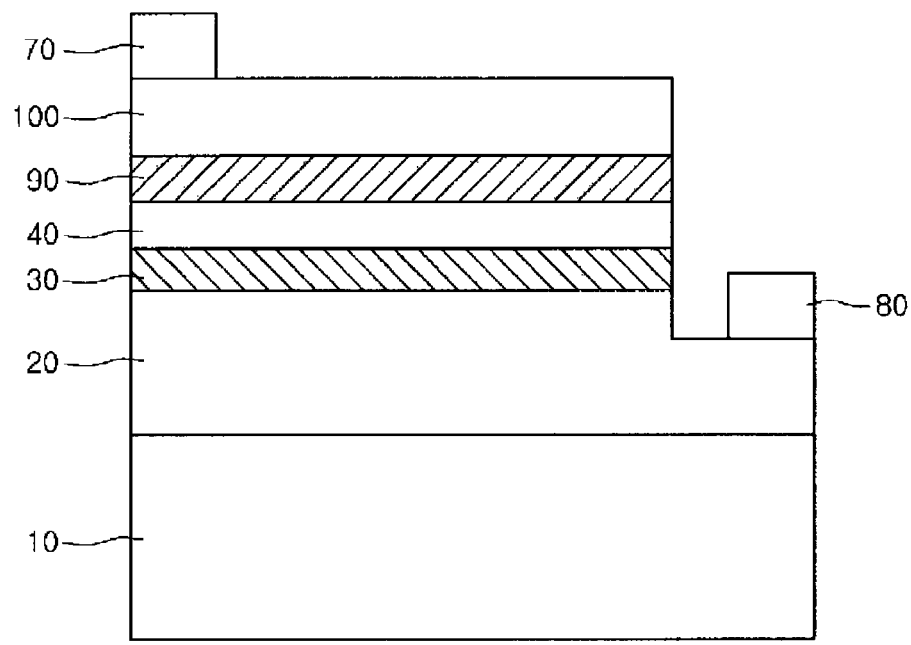
FIG. 3 is a sectional view showing a light emitting device according to a first embodiment.

FIG. 3 is a sectional view showing the light emitting device according to a first embodiment.

Referring to FIG. 3, the light emitting semiconductor layer including the first conductive semiconductor layer 20, the active layer 30, and the second conductive semiconductor layer 40 is formed on the growth substrate 10.

Then, the superlattice structure layer 90 and the first current spreading layer 100 are formed on the second conductive semiconductor layer 40.

Although not shown, as shown in FIG. 2, the stack structure of the superlattice structure layer 90 and the first current spreading layer 100 may be repeatedly formed.

The first current spreading layer 100, the superlattice structure layer 90, the second conductive semiconductor layer 40, the active layer 30, and the first conductive semiconductor layer 20 are partially removed through a MESA etching process, so that the first conductive semiconductor layer 20 is partially exposed upward.

A first electrode layer 80 is formed on the first conductive semiconductor layer 20, and a second electrode layer 70 is formed on the first current spreading layer 100.

The first electrode layer 80 forms an ohmic contact interface with respect to the first conductive semiconductor layer 20, and the second electrode layer 70 forms a schottky contact interface with respect to the first current spreading layer 100. For example, the first electrode layer 80 may include metal such as Cr/Al, and the second electrode layer 70 may include metal such as Pd/Au.

In the light emitting device according to the first embodiment, since the superlattice structure layer 90 and the first current spreading layer 100 form ohmic contact interfaces, current can be uniformly spread, so that the light emission efficiency of the light emitting device can be increased.

Figure 4:
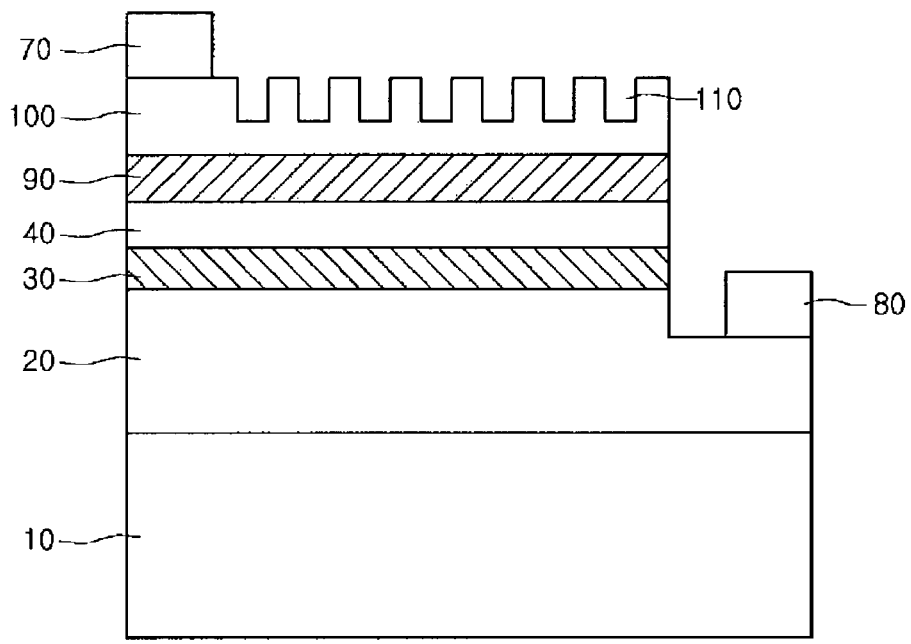
FIG. 4 is a sectional view showing a light emitting device according to a second embodiment.

FIG. 4 is a sectional view showing a light emitting device according to a second embodiment.

Referring to FIG. 4, the light emitting semiconductor layer including the first conductive semiconductor layer 20, the active layer 30, and the second conductive semiconductor layer 40 is formed on the growth substrate 10. Then, the superlattice structure layer 90 and the first current spreading layer 100 are formed on the second conductive semiconductor layer 40.

Although not shown, as shown in FIG. 2, the stack structure of the superlattice structure layer 90 and the first current spreading layer 100 may be repeatedly formed.

The first current spreading layer 100, the superlattice structure layer 90, the second conductive semiconductor layer 40, the active layer 30, and the first conductive semiconductor layer 20 are partially removed through a MESA etching process, so that the first conductive semiconductor layer 20 is partially exposed upward.

The first electrode layer 80 is formed on the first conductive semiconductor layer 20, and the second electrode layer 70 is formed on the first current spreading layer 100.

The first electrode layer 80 forms an ohmic contact interface with respect to the first conductive semiconductor layer 20, and the second electrode layer 70 forms a schottky contact interface with respect to the first current spreading layer 100. For example, the first electrode layer 80 may include metal such as Cr/Al, and the second electrode layer 70 may include metal such as Pd/Au.

Meanwhile, the first current spreading layer 100 includes a light extracting structure 110 having a concave-convex pattern. The light extracting structure 110 is obtained by performing a dry etching process or a wet etching process with respect to the first current spreading layer 100. The light extracting structure 110 minimizes light totally reflected in the light emitting device, so that the light emission efficiency of the light emitting device can be improved.

In the light emitting device according to the second embodiment, since the superlattice structure layer 90 and the first current spreading layer 100 form ohmic contact interfaces, current can be uniformly spread, so that the light emission efficiency of the light emitting device can be increased.

In the light emitting device according to the second embodiment, the light extracting structure 110 is formed on the top surface of the first current spreading layer 100 provided on the superlattice structure layer 90, so that the light extraction efficiency can be increased while preventing the electrical characteristics of the light emitting device from being degraded.

Figure 5:
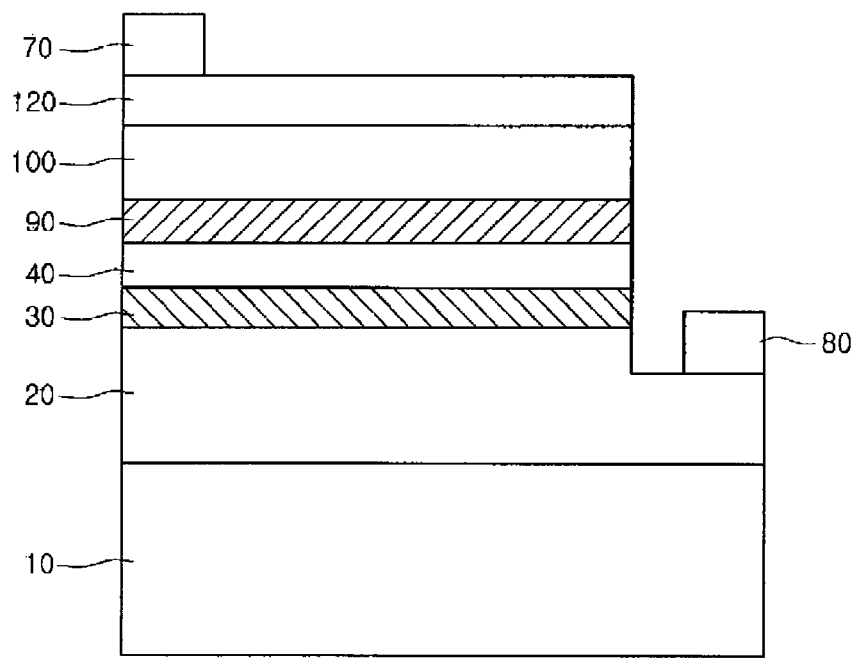
FIG. 5 is a sectional view showing a light emitting device according to a third embodiment.

FIG. 5 is a view showing a light emitting device according to a third embodiment.

Referring to FIG. 5, the light emitting semiconductor layer including the first conductive semiconductor layer 20, the active layer 30, and the second conductive semiconductor layer 40 is formed on the growth substrate 10. Then, the superlattice structure layer 90, the first current spreading layer 100, and a second current spreading layer 120 are formed on the second conductive semiconductor layer 40.

Although not shown, as shown in FIG. 2, the stack structure of the superlattice structure layer 90 and the first current spreading layer 100 may be repeatedly formed.

The second current spreading layer 120, the first current spreading layer 100, the superlattice structure layer 90, the second conductive semiconductor layer 40, the active layer 30, and the first conductive semiconductor layer 20 are partially removed through a MESA etching process, so that the first conductive semiconductor layer 20 is partially exposed upward.

Then, the first electrode layer 80 is formed on the first conductive semiconductor layer 20, and the second electrode layer 70 is formed on the first current spreading layer 100.

The first electrode layer 80 forms an ohmic contact interface with respect to the first conductive semiconductor layer 20, and the second electrode layer 70 forms a schottky contact interface with respect to the second current spreading layer 120. For example, the first electrode layer 80 may include metal such as Cr/Al, and the second electrode layer 70 may include metal such as Pd/Au.

Meanwhile, the first current spreading layer 100 may form an ohmic contact interface, and may include a group III nitride-based conductive thin film having sheet resistance of 50Ω/□ or less. The first current spreading layer 100 may include a single layer structure or a multi-layer structure represented through a chemical formula of $In_xAl_yGa_{(1-x-y)}N$ ($0 \leq x$, $0 \leq y$, $x+y \leq 1$) and having a thickness of 6 nm or more. In addition, the first current spreading layer 100 may be doped with Si, Mg, or Zn. For example, the first current spreading layer 100 may include GaN doped with Si or AlGaN doped with Si.

The second current spreading layer 120 may form an ohmic contact interface, and may include a transparent conductive thin film having sheet resistance of 50Ω/□ or less. For example, the second current spreading layer 120 includes a material, such as ITO or ZnO, having 70% or more of light transmittance in a wavelength band of 600 nm or less. The second current spreading layer 120 may have a single layer structure or a multi-layer structure having a thickness of 5 nm or more.

In the light emitting device according to the third embodiment, since the superlattice structure layer 90, the first current spreading layer 100, and the second current spreading layer form ohmic contact interfaces, current can be uniformly spread, so that the light emission efficiency of the light emitting device can be increased.

Figure 6:
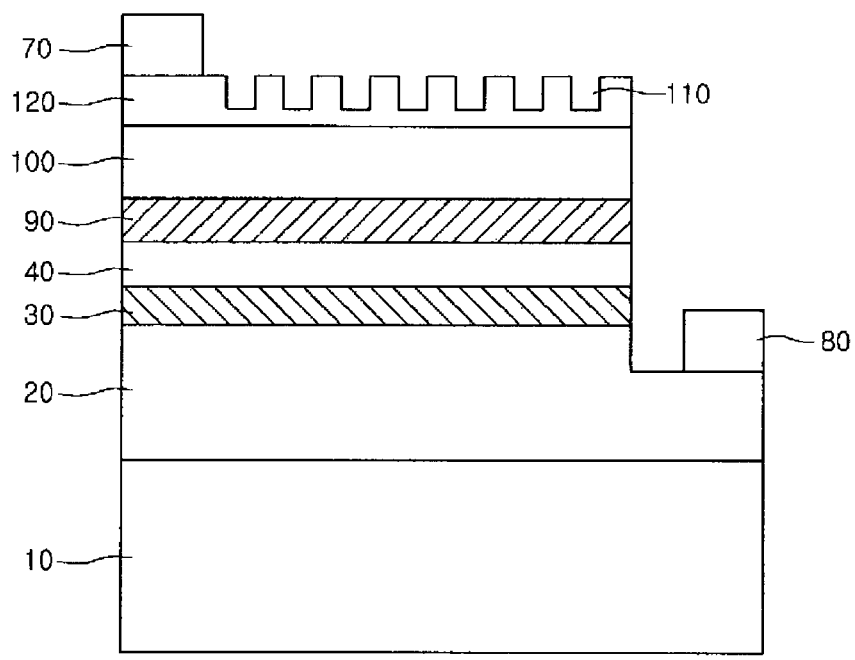
FIG. 6 is a sectional view showing a light emitting device according to a fourth embodiment.

FIG. 6 is a sectional view showing a light emitting device according to a fourth embodiment.

Referring to FIG. 6, the light emitting semiconductor layer including the first conductive semiconductor layer 20, the active layer 30, and the second conductive semiconductor layer 40 is formed on the growth substrate 10. Then, the superlattice structure layer 90, the first current spreading layer 100, and the second current spreading layer 120 are formed on the second conductive semiconductor layer 40.

Although not shown, as shown in FIG. 2, the stack structure of the superlattice structure layer 90 and the first current spreading layer 100 may be repeatedly formed.

The second current spreading layer 120, the first current spreading layer 100, the superlattice structure layer 90, the second conductive semiconductor layer 40, the active layer 30, and the first conductive semiconductor layer 20 are partially removed through a MESA etching process, so that the first conductive semiconductor layer 20 is partially exposed upward.

The first electrode layer 80 is formed on the first conductive semiconductor layer 20, and the second electrode layer 70 is formed on the first current spreading layer 100.

The first electrode layer 80 forms an ohmic contact interface with respect to the first conductive semiconductor layer 20, and the second electrode layer 70 forms a schottky contact interface with respect to the second current spreading layer 120. For example, the first electrode layer 80 may include metal such as Cr/Al, and the second electrode layer 70 may include metal such as Pd/Au.

Meanwhile, the first current spreading layer 100 may form an ohmic contact interface, and may include a group III nitride-based conductive thin film having sheet resistance of 50Ω/□ or less. The first current spreading layer 100 may include a single layer structure or a multi-layer structure represented through a chemical formula of $In_xAl_yGa_{(1-x-y)}N$ (0≤x, 0≤y, x+y≤1) and having a thickness of 6 nm or more. In addition, the first current spreading layer 100 may be doped with Si, Mg, or Zn. For example, the first current spreading layer 100 may include GaN doped with Si or AlGaN doped with Si.

The second current spreading layer 120 may form an ohmic contact interface, and may include a transparent conductive thin film having sheet resistance of 50Ω/□ or less. For example, the second current spreading layer 120 includes a material, such as ITO or ZnO, having 70% or more of light transmittance in a wavelength band of 600 nm or less. The second current spreading layer 120 may have a single layer structure or a multi-layer structure having a thickness of 5 nm or more.

Meanwhile, the second current spreading layer 120 includes the light extracting structure 110 having a concave-convex pattern. The light extracting structure 110 is obtained by performing a dry etching process or a wet etching process with respect to the second current spreading layer 120. The light extracting structure 110 minimizes light totally reflected in the light emitting device, so that the light emission efficiency of the light emitting device can be improved.

In the light emitting device according to the fourth embodiment, since the superlattice structure layer 90, the first current spreading layer 100, and the second current spreading layer 120 form ohmic contact interfaces, current can be uniformly spread, so that the light emission efficiency of the light emitting device can be increased.

In the light emitting device according to the fourth embodiment, the light extracting structure 110 is formed on the top surface of the second current spreading layer 120 provided on the superlattice structure layer 90 and the first current spreading layer 120, so that the light extraction efficiency can be increased while preventing the electrical characteristics of the light emitting device from being degraded.

Figure 7:
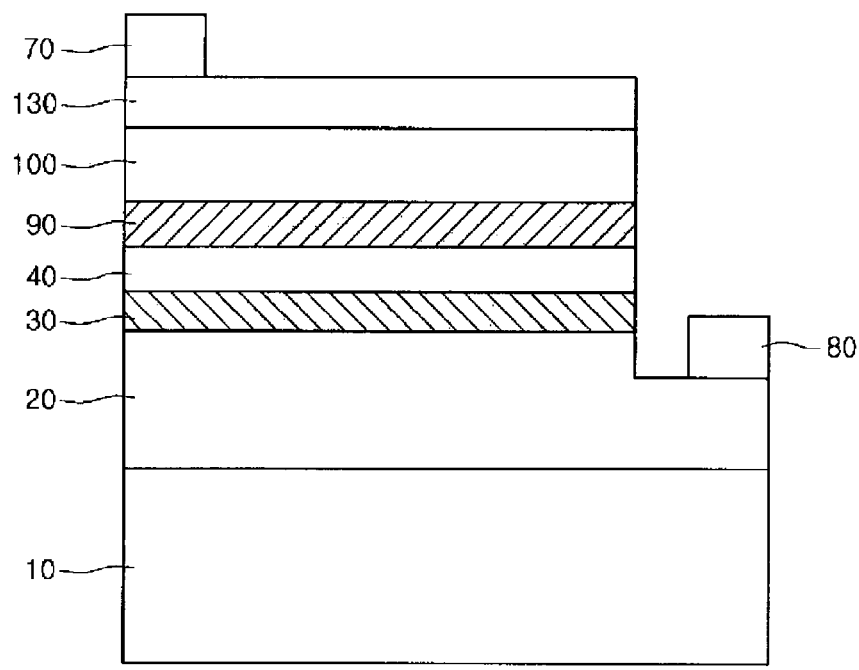
FIG. 7 is a sectional view showing a light emitting device according to a fifth embodiment.

FIG. 7 is a sectional view showing a light emitting device according to a fifth embodiment.

FIG. 7 illustrates a light emitting device having a flip-chip structure. Referring to FIG. 7, the light emitting semiconductor layer including the first conductive semiconductor layer 20, the active layer 30, and the second conductive semiconductor layer 40 is formed on the growth substrate 10. Then, the superlattice structure layer 90, the first current spreading layer 100, and a third current spreading layer 130 are formed on the second conductive semiconductor layer 40.

Although not shown, as shown in FIG. 2, the stack structure of the superlattice structure layer 90 and the first current spreading layer 100 may be repeatedly formed.

The third current spreading layer 130, the first current spreading layer 100, the superlattice structure layer 90, the second conductive semiconductor layer 40, the active layer 30, and the first conductive semiconductor layer 20 are partially removed through a MESA etching process, so that the first conductive semiconductor layer 20 is partially exposed upward.

Then, t first electrode layer 80 is formed on the first conductive semiconductor layer 20, and the second electrode layer 70 is formed on the third current spreading layer 100.

The first electrode layer 80 forms an ohmic contact interface with respect to the first conductive semiconductor layer 20, and the second electrode layer 70 forms a schottky contact interface with respect to the third current spreading layer 130. For example, the first electrode layer 80 may include metal such as Cr/Al, and the second electrode layer 70 may include metal such as Pd/Au.

The first current spreading layer 100 may form an ohmic contact interface, and may include a group III nitride-based conductive thin film having sheet resistance of 50Ω/□ or less. The first current spreading layer 100 may include a single layer structure or a multi-layer structure represented through a chemical formula of $In_xAl_yGa_{(1-x-y)}N$ (0≤x, 0≤y, x+y≤1) and having a thickness of 6 nm or more. In addition, the first current spreading layer 100 may be doped with Si, Mg, or Zn. For example, the first current spreading layer 100 may include GaN doped with Si or AlGaN doped with Si.

The third current spreading layer 130 may form an ohmic contact interface, and may include a reflective conductive thin film having sheet resistance of 50Ω/□ or less. For example, the third current spreading layer 130 includes a material, such as Ag or Al, having 70% or more of a light reflective rate in a wavelength band of 600 nm or less. The third current spreading layer 130 may have a single layer structure or a multi-layer structure having a thickness of 200 nm or more.

Accordingly, the light emitted from the active layer 30 is reflected by the third current spreading layer 130 and directed toward the growth substrate 10.

In the light emitting device according to the fifth embodiment, since the superlattice structure layer 90, the first current spreading layer 100, and the third current spreading layer 130 form ohmic contact interfaces, current can be uniformly spread, so that the light emission efficiency of the light emitting device can be increased.

Different from the second current spreading layer 120 including a transmissive conductive thin film according to the third and fourth embodiments, the light emitting device according to the fifth embodiment includes the third current spreading layer 130 including a reflective conductive thin film. In the transmissive conductive thin film, which is used as the second current spreading layer 120 and includes ITO or ZnO, transmittance has a trade-off relation with electrical conductivity. In other words, in order to enhance transmittance of the second current spreading layer 120, the second current spreading layer 120 has to be a thin thickness. However, in this case, resistance may be increased. In contrast, in order to reduce resistance, the second current spreading layer 120 has to be formed a thick thickness. However, in this case, the transmittance of the second current spreading layer 120 may be lowered.

Therefore, the light emitting device according to the fifth embodiment includes the third current spreading layer 130 including a reflective conductive thin film, so that the light emitted from the active layer 30 can be directed toward the substrate 10. In this case, since the third current spreading layer 130 can be formed at the thickness of about 200 nm or more, resistance can be lowered.

The light emitting device according to the fifth embodiment includes the superlattice structure layer 90 and the first current spreading layer 100 between the second conductive semiconductor layer 40 and the third current spreading layer 130. When Ag or Al constituting the third current spreading layer 130 makes contact with the second conductive semiconductor layer 40, the third current spreading layer 130 forms a schottky contact interface. Accordingly, if the third current spreading layer 130 is directly formed on the second conductive semiconductor layer 40, the light efficiency of the light emitting device may be degraded. However, in the light emitting device according to the fifth embodiment, since the third current spreading layer 130 is formed on the first current spreading layer 100, a superior ohmic contact interface can be obtained.

Figure 8:
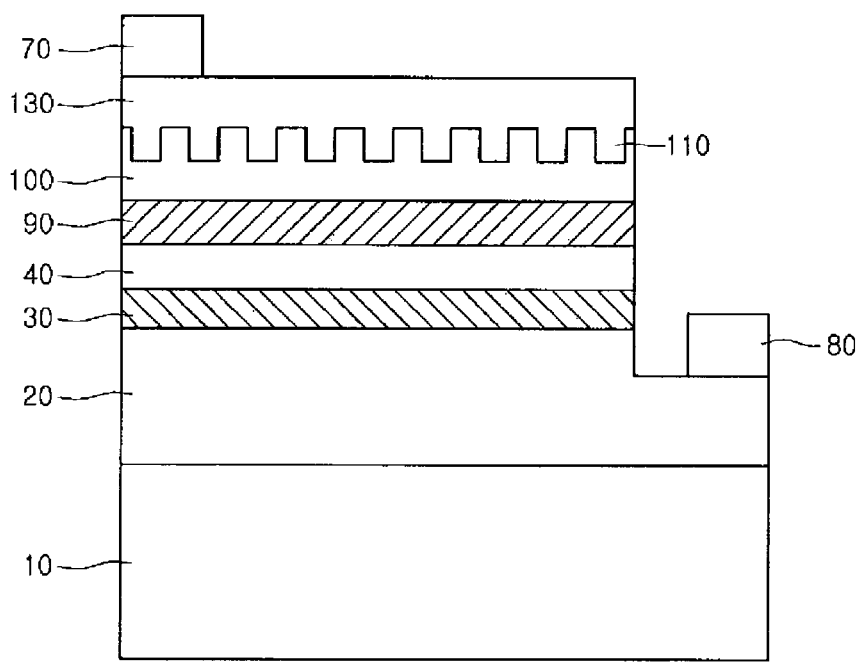
FIG. 8 is a sectional view showing a light emitting device according to a sixth embodiment.

FIG. 8 is a sectional view showing a light emitting device according to a sixth embodiment.

Hereinafter, the sixth embodiment will be described while focusing on the difference from the fifth embodiment in order to avoid redundancy.

FIG. 8 illustrates a light emitting device having a flip-chip structure. Referring to FIG. 8, the light emitting semiconductor layer including the first conductive semiconductor layer 20, the active layer 30, and the second conductive semiconductor layer 40 is formed on the growth substrate 10. Then, the superlattice structure layer 90, the first current spreading layer 100, and the third current spreading layer 130 are formed on the second conductive semiconductor layer 40.

Although not shown, as shown in FIG. 2, the stack structure of the superlattice structure layer 90 and the first current spreading layer 100 may be repeatedly formed.

The third current spreading layer 130, the first current spreading layer 100, the superlattice structure layer 90, the second conductive semiconductor layer 40, the active layer 30, and the first conductive semiconductor layer 20 are partially removed through a MESA etching process, so that the first conductive semiconductor layer 20 is partially exposed upward.

In addition, the first electrode layer 80 is formed on the first conductive semiconductor layer 20, and the second electrode layer 70 is formed on the third current spreading layer 130.

The first electrode layer 80 forms an ohmic contact interface with respect to the first conductive semiconductor layer 20, and the second electrode layer 70 forms a schottky contact interface with respect to the third current spreading layer 130. For example, the first electrode layer 80 may include metal such as Cr/Al, and the second electrode layer 70 may include metal such as Pd/Au.

The first current spreading layer 100 may form an ohmic contact interface, and may include a group III nitride-based conductive thin film having sheet resistance of 50Ω/□ or less. The first current spreading layer 100 may include a single layer structure or a multi-layer structure represented through a chemical formula of $In_xAl_yGa_{(1-x-y)}N$ ($0 \leq x$, $x+y \leq 1$) and having a thickness of 6 nm or more. In addition, the first current spreading layer 100 may be doped with Si, Mg, or Zn. For example, the first current spreading layer 100 may include GaN doped with Si or AlGaN doped with Si.

The third current spreading layer 130 may form an ohmic contact interface, and may include a reflective conductive thin film having sheet resistance of 50Ω/□ or less. For example, the third current spreading layer 130 includes a material, such as Ag or Al, having 70% or more of a light reflective rate in a wavelength band of 600 nm or less. The third current spreading layer 130 may have a single layer structure or a multi-layer structure having a thickness of 200 nm or more.

Accordingly, the light emitted from the active layer 30 is reflected by the third current spreading layer 130 and directed toward the growth substrate 10.

Meanwhile, the first current spreading layer 100 includes the light extracting structure 110 having a concave-convex pattern. The light extracting structure 110 is obtained by performing a dry etching process or a wet etching process with respect to the first current spreading layer 100. The light extracting structure 110 minimizes light totally reflected in the light emitting device, so that the light emission efficiency of the light emitting device can be improved.

In the light emitting device according to the sixth embodiment, since the superlattice structure layer 90, the first current spreading layer 100, and the third current spreading layer 130 form ohmic contact interfaces, current can be uniformly spread, so that the light emission efficiency of the light emitting device can be increased.

In the light emitting device according to the sixth embodiment, the light extracting structure 110 is formed on the top surface of the first current spreading layer 100 provided on the superlattice structure layer 90, so that the light extraction efficiency can be increased while preventing the electrical characteristics of the light emitting device from being degraded.

Figure 9:
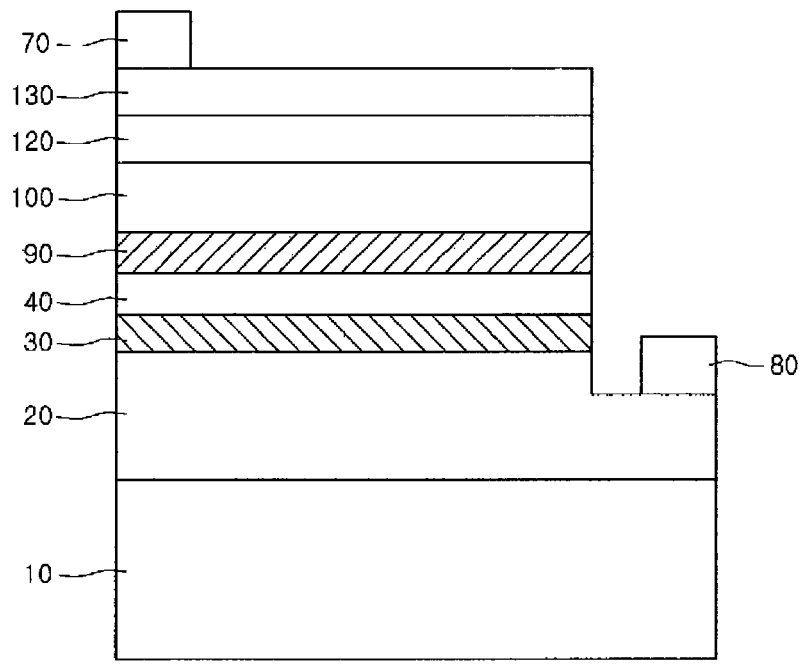
FIG. 9 is a sectional view showing a light emitting device according to a seventh embodiment.

FIG. 9 is a sectional view showing a light emitting device according to a seventh embodiment.

Hereinafter, the seventh embodiment will be described while focusing on the difference from the fifth embodiment in order to avoid redundancy.

FIG. 9 illustrates a light emitting device having a flip-chip structure. Referring to FIG. 9, the light emitting semiconductor layer including the first conductive semiconductor layer 20, the active layer 30, and the second conductive semiconductor layer 40 is formed on the growth substrate 10. Then, the superlattice structure layer 90, the first current spreading layer 100, the second current spreading layer 120, and the third current spreading layer 130 are formed on the second conductive semiconductor layer 40.

Although not shown, as shown in FIG. 2, the stack structure of the superlattice structure layer 90 and the first current spreading layer 100 may be repeatedly formed.

The third current spreading layer 130, the second current spreading layer 120, the first current spreading layer 100, the superlattice structure layer 90, the second conductive semiconductor layer 40, the active layer 30, and the first conductive semiconductor layer 20 are partially removed through a MESA etching process, so that the first conductive semiconductor layer 20 is partially exposed upward.

The first electrode layer 80 is formed on the first conductive semiconductor layer 20, and the second electrode layer 70 is formed on the third current spreading layer 130.

The first electrode layer 80 forms an ohmic contact interface with respect to the first conductive semiconductor layer 20, and the second electrode layer 70 forms a schottky contact interface with respect to the third current spreading layer 130. For example, the first electrode layer 80 may include metal such as Cr/Al, and the second electrode layer 70 may include metal such as Pd/Au.

The first current spreading layer 100 may form an ohmic contact interface, and may include a group III nitride-based conductive thin film having sheet resistance of 50Ω/□ or less. The first current spreading layer 100 may include a single layer structure or a multi-layer structure represented through a chemical formula of $In_xAl_yGa_{(1-x-y)}N$ (0≤x, 0≤y, x+y≤1) and having a thickness of 6 nm or more. In addition, the first current spreading layer 100 may be doped with Si, Mg, or Zn. For example, the first current spreading layer 100 may include GaN doped with Si or AlGaN doped with Si.

The second current spreading layer 120 may form an ohmic contact interface, and may include a transparent conductive thin film having sheet resistance of 50Ω/□ or less. For example, the second current spreading layer 120 includes a material, such as ITO or ZnO, having 70% or more of light transmittance in a wavelength band of 600 nm or less. The second current spreading layer 120 may have a single layer structure or a multi-layer structure having a thickness of 5 nm or more.

The third current spreading layer 130 may form an ohmic contact interface, and may include a reflective conductive thin film having sheet resistance of 50Ω/□ or less. For example, the third current spreading layer 130 includes a material, such as Ag or Al, having 70% or more of a light reflective rate in a wavelength band of 600 nm or less. The third current spreading layer 130 may have a single layer structure or a multi-layer structure having a thickness of 200 nm or more.

Accordingly, the light emitted from the active layer 30 is reflected by the third current spreading layer 130 and directed toward the growth substrate 10.

In the light emitting device according to the seventh embodiment, since the superlattice structure layer 90, the first current spreading layer 100, the second current spreading layer 120 and the third current spreading layer 130 form ohmic contact interfaces, current can be uniformly spread, so that the light emission efficiency of the light emitting device can be increased.

The light emitting device according to the seventh embodiment includes the third current spreading layer 130 including a reflective conductive thin film, so that the light emitted from the active layer 30 is directed to the growth substrate 10. In this case, since the third current spreading layer 130 can be formed at a thick thickness of 200 nm or more, resistance can be reduced.

Figure 10:
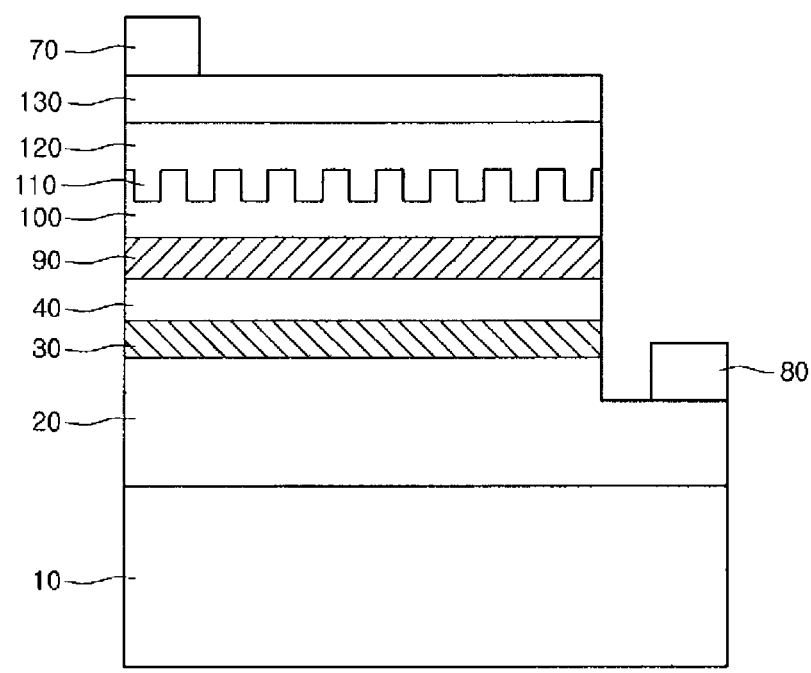
FIG. 10 is a sectional view showing a light emitting device according to an eighth embodiment.

FIG. 10 is a sectional view showing a light emitting device according to an eighth embodiment.

Hereinafter, the eighth embodiment will be described while focusing on the difference from the fifth embodiment in order to avoid redundancy.

FIG. 10 illustrates a light emitting device having a flip-chip structure. Referring to FIG. 10, the light emitting semiconductor layer including the first conductive semiconductor layer 20, the active layer 30, and the second conductive semiconductor layer 40 is formed on the growth substrate 10. Then, the superlattice structure layer 90, the first current spreading layer 100, the second current spreading layer 120, and the third current spreading layer 130 are formed on the second conductive semiconductor layer 40.

Although not shown, as shown in FIG. 2, the stack structure of the superlattice structure layer 90 and the first current spreading layer 100 may be repeatedly formed.

The third current spreading layer 130, the second current spreading layer 120, the first current spreading layer 100, the superlattice structure layer 90, the second conductive semiconductor layer 40, the active layer 30, and the first conductive semiconductor layer 20 are partially removed through a MESA etching process, so that the first conductive semiconductor layer 20 is partially exposed upward.

The first electrode layer 80 is formed on the first conductive semiconductor layer 20, and the second electrode layer 70 is formed on the third current spreading layer 130.

The first electrode layer 80 forms an ohmic contact interface with respect to the first conductive semiconductor layer 20, and the second electrode layer 70 forms a schottky contact interface with respect to the third current spreading layer 130. For example, the first electrode layer 80 may include metal such as Cr/Al, and the second electrode layer 70 may include metal such as Pd/Au.

Meanwhile, the first current spreading layer 100 may form an ohmic contact interface, and may include a group III nitride-based conductive thin film having sheet resistance of 50Ω/□ or less. The first current spreading layer 100 may include a single layer structure or a multi-layer structure represented through a chemical formula of $In_xAl_yGa_{(1-x-y)}N$ (0≤x, 0≤y, x+y≤1) and having a thickness of 6 nm or more. In addition, the first current spreading layer 100 may be doped with Si, Mg, or Zn. For example, the first current spreading layer 100 may include GaN doped with Si or AlGaN doped with Si.

The second current spreading layer 120 may form an ohmic contact interface, and may include a transparent conductive thin film having sheet resistance of 50Ω/□ or less. For example, the second current spreading layer 120 includes a material, such as ITO or ZnO, having 70% or more of light transmittance in a wavelength band of 600 nm or less. The second current spreading layer 120 may have a single layer structure or a multi-layer structure having a thickness of 5 nm or more.

The third current spreading layer 130 may form an ohmic contact interface, and may include a reflective conductive thin film having sheet resistance of 50Ω/□ or less. For example, the third current spreading layer 130 includes a material, such as Ag or Al, having 70% or more of a light reflective rate in a wavelength band of 600 nm or less. The third current spreading layer 130 may have a single layer structure or a multi-layer structure having a thickness of 200 nm or more.

Accordingly, the light emitted from the active layer 30 is reflected by the third current spreading layer 130 and directed toward the growth substrate 10.

Meanwhile, the first current spreading layer 100 includes the light extracting structure 110 having a concave-convex pattern. The light extracting structure 110 is obtained by performing a dry etching process or a wet etching process with respect to the first current spreading layer 100. The light extracting structure 110 minimizes light totally reflected in the light emitting device, so that the light emission efficiency of the light emitting device can be improved.

In the light emitting device according to the eighth embodiment, since the superlattice structure layer 90, the first current spreading layer 100, the second current spreading layer 120 and the third current spreading layer 130 form ohmic contact interfaces, current can be uniformly spread, so that the light emission efficiency of the light emitting device can be increased.

In addition, the light emitting device according to the eighth embodiment includes the light extracting structure 110 formed on the top surface of the first current spreading layer 100 provided on the superlattice structure layer 90, so that the light extraction efficiency can be increased while preventing the electrical characteristics of the light emitting device being degraded.

The light emitting device according to the eighth embodiment includes the third current spreading layer 130 including a reflective conductive thin film, so that the light emitted from the active layer 30 is directed to the growth substrate 10. In this case, since the third current spreading layer 130 can be formed at a thick thickness of 200 nm or more, resistance can be reduced.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The embodiments are applicable to a light emitting device used as a light source.

The invention claimed is:
1. A light emitting device comprising:
a first conductive semiconductor layer;
an active layer over a top surface of the first conductive semiconductor layer;
a second conductive semiconductor layer over a top surface of the active layer;
a superlattice structure layer over a top surface of the second conductive semiconductor layer, the superlattice structure layer having a multi-layer structure;
a first current spreading layer over a top surface of the superlattice structure layer, the first current spreading layer including a group III nitride-based conductive thin film;
a second current spreading layer over a top surface of the first current spreading layer, the second current spreading layer including a transmissive conductive thin film;
a third current spreading layer over a top surface of the second current spreading layer, the third current spreading layer including a reflective conductive thin film; and
a second electrode layer on the reflective conductive thin film,
wherein the top surface of the first current spreading layer comprises a first light extracting structure having a concave pattern or a convex pattern;
wherein the first current spreading layer forms an ohmic contact interface with respect to the superlattice structure layer,
wherein a material of the first light extracting structure is same as a material of the first current spreading layer,
wherein the superlattice structure layer is directly in contact with the second conductive semiconductor layer, and
wherein the transmissive conductive thin film is spaced apart from the superlattice structure layer.
2. The light emitting device of claim 1, wherein the superlattice structure layer includes an InGaN layer doped with N type impurities, or an InGaN layer doped with P type impurities.
3. The light emitting device of claim 1, wherein the second current spreading layer includes one selected from the group consisting of ITO and ZnO.
4. A light emitting device comprising:
a first conductive semiconductor layer;
an active layer over the first conductive semiconductor layer;
a second conductive semiconductor layer over the active layer;
a superlattice structure layer over the second conductive semiconductor layer, the superlattice structure layer having a multi-layer structure;
a first current spreading layer over the superlattice structure layer, the first current spreading layer including a transmissive conductive thin film;
a second current spreading layer over the first current spreading layer, the second current spreading layer including a transmissive conductive thin film;
a third current spreading layer over the second current spreading layer, the third current spreading layer including a reflective conductive thin film; and
a second electrode layer on the reflective conductive thin film,
wherein a top surface of the first current spreading layer comprises a first light extracting structure having a concave pattern or a convex pattern,
wherein the second conductive semiconductor layer is disposed between the superlattice structure and the active layer,
wherein the superlattice structure is disposed between the second conductive semiconductor layer and the first current spreading layer,
wherein the first current spreading layer includes a group III nitride-based conductive thin film,
wherein a material of the first light extracting structure is same as a material of the first current spreading layer,
wherein the superlattice structure layer is directly in contact with the second conductive semiconductor layer, and
wherein the transmissive conductive thin film is spaced apart from the superlattice structure layer.
5. The light emitting device of claim 4, wherein the multi-layer structure of the superlattice structure layer includes at least one selected from the group consisting of InN, InGaN, InAlN, AlGaN, GaN, AlInGaN, AlN, SiC, SiCN, MgN, ZnN, and SiN.
6. The light emitting device of claim 4, wherein the second current spreading layer includes one selected from the group consisting of ITO and ZnO.
7. The light emitting device of claim 4, wherein the third current spreading layer includes one selected from the group consisting of Ag and Al.
8. The light emitting device of claim 1, wherein the third current spreading layer includes one selected from the group consisting of Ag and Al.
9. The light emitting device of claim 4, wherein the third current spreading layer includes one selected from the group consisting of Ag and Al.
10. The light emitting device of claim 1, wherein the first current spreading layer forms an ohmic contact interface with respect to the second current spreading layer.
11. The light emitting device of claim 10, wherein the first current spreading layer includes a group III nitride-based conductive thin film having sheet resistance of 50Ω/□ or less.
12. The light emitting device of claim 5, wherein the multi-layer structure of the superlattice structure layer are doped with N type impurities.
13. The light emitting device of claim 1, wherein the first conductive semiconductor layer is doped with N type impurities, and wherein the second conductive semiconductor layer is doped with P type impurities.

14. The light emitting device of claim 13, wherein the first current spreading layer includes GaN doped with Si or AlGaN doped with Si.

15. The light emitting device of claim 4, wherein the first conductive semiconductor layer is doped with N type impurities, and wherein the second conductive semiconductor layer is doped with P type impurities.

16. The light emitting device of claim 15, wherein the first current spreading layer includes GaN doped with Si or AlGaN doped with Si.

17. The light emitting device of claim 1, wherein a first electrode is provided on the first semiconductor layer to form an ohmic contact interface with the first semiconductor layer and a second electrode is provided on the third current spreading layer to form a Schottky contact interface with the third current spreading layer.

18. The light emitting device of claim 4, wherein a first electrode is provided on the first semiconductor layer to form an ohmic contact interface with the first semiconductor layer and a second electrode is provided on the third current spreading layer to form a Schottky contact interface with the third current spreading layer.

19. The light emitting device of claim 1, wherein a lateral width of the third current spreading layer is same with that of the second current spreading layer.

20. The light emitting device of claim 4, wherein a lateral width of the third current spreading layer is same with that of the second current spreading layer.

21. The light emitting device of claim 1, wherein the group III nitride-based conductive thin film is directly in contact with the superlattice structure layer, and wherein the transmissive conductive thin film comprises a second extracting structure corresponding to the second extracting structure.

22. The light emitting device of claim 4, wherein the group III nitride-based conductive thin film is directly in contact with the superlattice structure layer, and wherein the transmissive conductive thin film comprises a second extracting structure corresponding to the second extracting structure.

23. The light emitting device of claim 1, wherein an entire top surface of the transmissive conductive thin film is directly in contact with the reflective conductive thin film and wherein a lateral width of the reflective conductive thin film is substantially same with that of the transmissive conductive thin film.

24. The light emitting device of claim 4, wherein an entire top surface of the transmissive conductive thin film is directly in contact with the reflective conductive thin film and wherein a lateral width of the reflective conductive thin film is substantially same with that of the transmissive conductive thin film.

* * * * *